(12) United States Patent
Xue et al.

(10) Patent No.: US 12,501,802 B2
(45) Date of Patent: Dec. 16, 2025

(54) DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Longhui Xue, Beijing (CN); Weiyun Huang, Beijing (CN); Wei Zhang, Beijing (CN); Xingliang Xiao, Beijing (CN); Jianchang Cai, Beijing (CN); Yuanyou Qiu, Beijing (CN); Yao Huang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/761,522

(22) Filed: Jul. 2, 2024

(65) Prior Publication Data
US 2024/0357890 A1    Oct. 24, 2024

Related U.S. Application Data

(63) Continuation of application No. 17/285,248, filed as application No. PCT/CN2020/112562 on Aug. 31, 2020, now Pat. No. 12,058,903.

(30) Foreign Application Priority Data

Sep. 27, 2019 (CN) .................. 201910924594.8

(51) Int. Cl.
*H10K 59/131* (2023.01)
*H10K 59/121* (2023.01)
*H10K 59/126* (2023.01)

(52) U.S. Cl.
CPC ......... *H10K 59/131* (2023.02); *H10K 59/121* (2023.02); *H10K 59/126* (2023.02)

(58) Field of Classification Search
None
See application file for complete search history.

(56) References Cited

U.S. PATENT DOCUMENTS

| 8,665,202 B2 | 3/2014 | Tsubata |
| 10,825,875 B2 | 11/2020 | Zhao et al. |

(Continued)

FOREIGN PATENT DOCUMENTS

| CN | 109031833 A | 12/2018 |
| CN | 109148540 A | 1/2019 |

(Continued)

OTHER PUBLICATIONS

Office Action mailed Oct. 19, 2023 in U.S. Appl. No. 17/285,248.
International Search Report and Written Opinion mailed Dec. 7, 2020 in International Application No.

*Primary Examiner* — Long Pham
(74) *Attorney, Agent, or Firm* — Dilworth & Barrese, LLP.; Michael J. Musella, Esq.

(57) ABSTRACT

Disclosed are a display panel and a display device. The display panel includes: a substrate, a pixel array including a plurality of pixel units arranged on the substrate, a circuit structure including at least two first conductive patterns and at least one second conductive pattern, a light shielding portion including a first light shielding portion. Orthographic projections of the first conductive patterns on the substrate are separated from each other by a first gap. An orthographic projection of at least a part of the first gap on the substrate is within an orthographic projection of the first light shielding portion on the substrate and within an orthographic projection of the second conductive pattern on the substrate. The at least one second conductive pattern extends (Continued)

in a direction different from a direction in which the at least two first conductive patterns extend, so as to span the first conductive patterns.

16 Claims, 10 Drawing Sheets

(56) References Cited

U.S. PATENT DOCUMENTS

| | | | |
|---|---|---|---|
| 10,886,304 | B2 | 1/2021 | Huang et al. |
| 2022/0344432 | A1* | 10/2022 | Shi ........................ G09G 3/3233 |
| 2022/0352285 | A1* | 11/2022 | Shi ..................... H10K 59/8794 |
| 2022/0376020 | A1 | 11/2022 | Yang et al. |
| 2023/0012412 | A1* | 1/2023 | Long ....................... H01L 21/77 |
| 2023/0045968 | A1 | 2/2023 | Wu et al. |

FOREIGN PATENT DOCUMENTS

| | | |
|---|---|---|
| CN | 109581761 A | 4/2019 |
| CN | 110634930 A | 12/2019 |
| WO | 2010137230 A1 | 12/2010 |

* cited by examiner

DISPLAY PANEL AND DISPLAY DEVICE

This patent application is a continuation of U.S. application Ser. No. 17/285,248 filed on Apr. 14, 2021, which is a national stage application of International Application NO. PCT/CN2020/112562 filed on Aug. 31, 2020. All the aforementioned patent applications are hereby incorporated by reference in their entireties and claims priority to Chinese National application No. 201910924594.8 filed on Sep. 27, 2019, each of which is incorporated by reference herein in its entirety.

TECHNICAL FIELD

Embodiments of the present disclosure relate to a display panel and a display device.

BACKGROUND

With the development of display electronic products such as mobile phones, the improvement of the screen-to-body ratio of display screen has become a product trend, and the essential functional components of mobile phones such as front cameras have become a major factor restricting the improvement of the screen-to-body ratio. To solve this problem, the industry has proposed a solution called "under-display camera" which combines a camera and a display panel into a display device. In such solution, the display device includes a display panel and a camera under the display panel. The region, corresponding to the under-display camera, of the display device can emit light and display as other regions, and the region also has the camera function. In order to enable more light to enter the camera under the display panel, the display panel is designed to have a high pixel density region and a low pixel density region, and the camera is arranged under the low pixel density region that allows more light to pass through.

SUMMARY

At least one embodiment of the present disclosure provides a display panel, which includes a transparent substrate, a pixel array, a circuit structure and a light shielding portion. The pixel array includes a plurality of pixel units arranged on the substrate, and at least one pixel unit of the plurality of pixel units includes at least one light-emitting element. The circuit structure is configured to drive the at least one light-emitting element and includes at least two first conductive patterns and at least one second conductive pattern. Orthographic projections of the at least two first conductive patterns on the substrate are separated from each other by a first gap, and the first gap causes at least a part of imaging light to be diffracted when passing through the first gap. The light shielding portion includes a first light shielding portion. An orthographic projection of at least a part of the first gap on the substrate is within an orthographic projection of the first light shielding portion on the substrate and within an orthographic projection of the second conductive pattern on the substrate. The at least one second conductive pattern extends in a direction different from a direction in which the at least two first conductive patterns extend, so as to span the at least two first conductive patterns.

For example, in some embodiments, the at least one light-emitting element includes a first electrode, a second electrode at one side of the first electrode away from the substrate, and a light-emitting layer between the first electrode and the second electrode. A second gap is between the orthographic projection of the first light shielding portion on the substrate and an orthographic projection of the first electrode on the substrate. The orthographic projections of the at least two first conductive patterns on the substrate extend through an orthographic projection of the second gap on the substrate. An orthographic projection of at least a part of the second gap on the substrate falls within the orthographic projection of the second conductive pattern on the substrate.

For example, in some embodiments, the light shielding portion is in a same layer as the first electrode, is made of a same material as the first electrode, and blocks the imaging light.

For example, in some embodiments, both the first electrode and the light shielding layer have a laminated structure, and the laminated structure includes a first conductive oxide layer, a second conductive oxide layer and a metal layer between the first conductive oxide layer and the second conductive oxide layer.

For example, in some embodiments, the first conductive oxide layer, the second conductive oxide layer and the metal layer are respectively a first indium tin oxide layer, a second indium tin oxide layer and a metallic silver layer.

For example, in some embodiments, the at least one pixel unit includes a first pixel unit and a second pixel unit. The at least two first conductive patterns include a trace line extending in a first direction and between the first pixel unit and the second pixel unit. The first light shielding portion is a strip extending in the first direction and between the first pixel unit and the second pixel unit. The second gap is between the orthographic projection of the first light shielding portion on the substrate and an orthographic projection of the first electrode of the first pixel unit on the substrate.

For example, in some embodiments, the first light shielding portion includes a first light shielding end portion close to the first pixel unit, a second light shielding end portion close to the second pixel unit, and an intermediate light shielding portion between the first light shielding end portion and the second light shielding end portion. The first light shielding end portion has a first width, the second light shielding end portion has a second width, the intermediate light shielding portion has a third width, and the third width is smaller than the first width and the second width, respectively.

For example, in some embodiments, the at least one light-emitting element includes a first light-emitting element and a second light-emitting element. The first pixel unit includes a first sub-pixel unit and a second sub-pixel unit. The first electrode includes a first sub-electrode and a second sub-electrode. The first sub-pixel unit includes the first light-emitting element, and the first light-emitting element includes the first sub-electrode. The second sub-pixel unit includes the second light-emitting element, and the second light-emitting element includes the second sub-electrode. The light shielding portion further includes a second light shielding portion. The circuit structure further includes at least two third conductive patterns and at least one fourth conductive pattern. Orthographic projections of the at least two third conductive patterns on the substrate are separated from each other by a third gap, and the third gap causes at least a part of the imaging light to be diffracted when passing through the third gap. An orthographic projection of at least a part of the third gap on the substrate is within an orthographic projection of the second light shielding portion on the substrate and within an orthographic projection of the fourth conductive pattern on the substrate. The at least one fourth conductive pattern extends in a direction different from a direction in which the at least two third conductive patterns extend, so as to span the at least two third conductive patterns.

For example, in some embodiments, the at least two first conductive patterns extend in the first direction, and the at least two third conductive patterns extend in a second direction perpendicular to the first direction. The second gap is between the orthographic projection of the first light shielding portion on the substrate and an orthographic projection of the first sub-electrode on the substrate. A fourth gap is between the orthographic projection of the second light shielding portion on the substrate and an orthographic projection of the second sub-electrode on the substrate. The orthographic projections of the at least two third conductive patterns on the substrate extend through an orthographic projection of the fourth gap on the substrate. An orthographic projection of at least a part of the fourth gap on the substrate falls within the orthographic projection of the fourth conductive pattern on the substrate.

For example, in some embodiments, the at least one fourth conductive pattern is respectively integrated with different first conductive patterns among the at least two first conductive patterns, and the at least one second conductive pattern is respectively integrated with different third conductive patterns among the at least two third conductive patterns.

For example, in some embodiments, the at least two first conductive patterns extend in parallel to each other in a first direction. And orthogonal projections of two side edges, opposite to each other in a second direction perpendicular to the first direction, of the first light shielding portion on the substrate are respectively located at an inner side of orthogonal projections of outermost two first conductive patterns among the at least two first conductive patterns on the substrate.

For example, in some embodiments, the at least two first conductive patterns include at least one selected from the group consisting of a gate line, a power line, a data line, a detection line, a reset line and a light emitting control line, and the at least one second conductive pattern includes at least one selected from the group consisting of a gate line, a power line, a data line, a detection line, a reset line and a light emitting control line.

For example, in some embodiments, a width of the first gap is less than 10 μm.

For example, in some embodiments, the light-emitting element is an organic light-emitting diode or a quantum dot light-emitting diode.

For example, in some embodiments, the display panel includes a first display region and a second display region, the first display region has a first pixel density, and the second display region has a second pixel density smaller than the first pixel density. The plurality of pixel units, the circuit structure and the light shielding portion are in the second display region.

For example, in some embodiments, the first display region surrounds the second display region.

At least one embodiment of the present disclosure provides a display device, which includes the display panel described above and an image sensor. An orthographic projection of the image sensor on the substrate is overlapped with an orthographic projection of the second display region on the substrate.

BRIEF DESCRIPTION OF THE DRAWINGS

In order to clearly illustrate the technical solutions of the embodiments of the disclosure, the drawings which need to be used in the embodiments will be briefly described in the following. It should be understood that the described drawings are only related to some embodiments of the disclosure and thus are not limitative to the disclosure. For those skilled in the art, other related drawings can be obtained according to the drawings without any inventive work.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

Figure 1A:
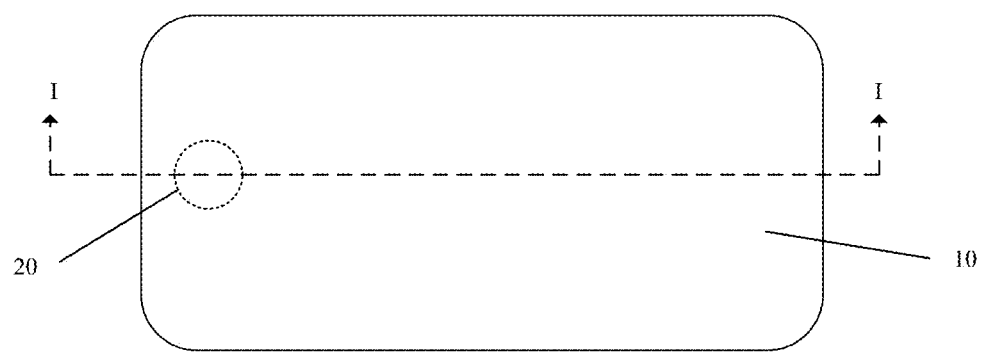
FIG. 1A is a schematic plan view of a display panel.
Figure 1B:
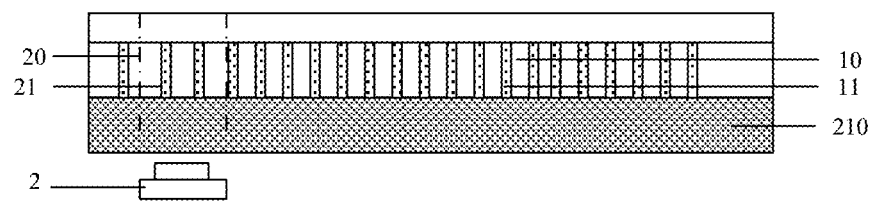
FIG. 1B is a schematic cross-sectional view of the display panel in FIG. 1A taken along line I-I.
Figure 2A:
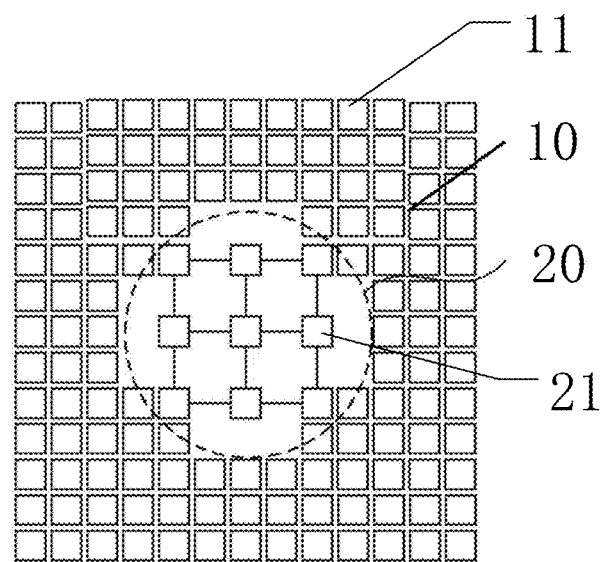
FIG. 2A is a partially enlarged view of the display panel in FIG. 1A.

FIG. 1A id a schematic plan view of a display panel, and FIG. 1B is a schematic cross-sectional view of the display panel in FIG. 1A taken along line I-I. FIG. 2A is a partially enlarged view of the display panel in FIG. 1A, and each square in this figure represents a pixel unit.

As shown in FIGS. 1A-2A, the display panel includes a first display region 10 and a second display region 20 at least partially surrounded by the first display region 10. The first display region 10 includes a plurality of first pixel units 11 arranged in an array, and the second display region 20 includes a plurality of second pixel units 21 arranged in an array. The first pixel unit 11 can further include a plurality of sub-pixel units, such as a red sub-pixel unit, a green sub-pixel unit, and a blue sub-pixel unit. Similarly, the second pixel unit 21 can further include a plurality of sub-pixel units, such as a red sub-pixel unit, a green sub-pixel unit and a blue sub-pixel unit.

As shown in FIG. 2A, the first display region 10 has a first pixel density (number of pixel units per unit area), and the second display region 20 has a second pixel density which is smaller than the first pixel density.

In the second display region 20, the blank region between the plurality of second pixel units 21 can allow more light to pass through, thereby improving the light transmittance of this region. Therefore, the second display region 20 has a greater light transmittance than the first display region 10. For example, as shown in FIG. 1B, the camera 2 can be arranged under the substrate 210 of the display panel located in the second display region 20, and the second display region 20 can meet the imaging requirements of the camera 2 on light transmittance.

In addition, the display panel includes a circuit structure for controlling the illumination of each sub-pixel unit, and the circuit structure includes various trace lines which provide control signals, data signals, power voltages, etc., for the pixel circuit in each sub-pixel unit of the pixel unit, such as gate lines, data lines, detection lines, power lines, etc. For example, the pixel circuit can be a 2T1C (two thin film transistors and one capacitor) pixel circuit or a 3T1C pixel circuit, etc.

Figure 2B:
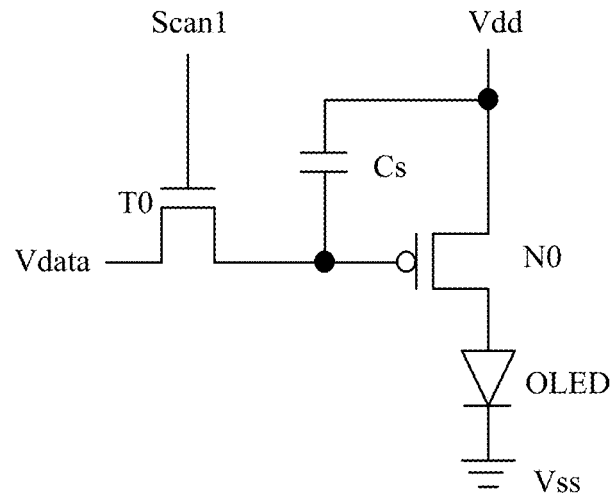
FIG. 2B is a schematic diagram of a pixel circuit.
Figure 2C:
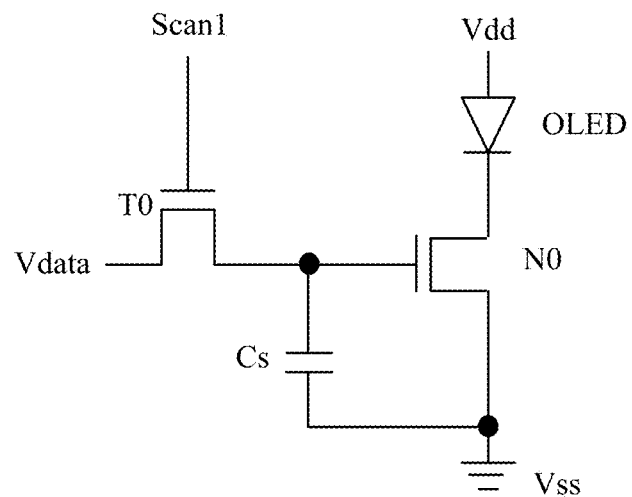
FIG. 2C is a schematic diagram of another pixel circuit.
Figure 2D:
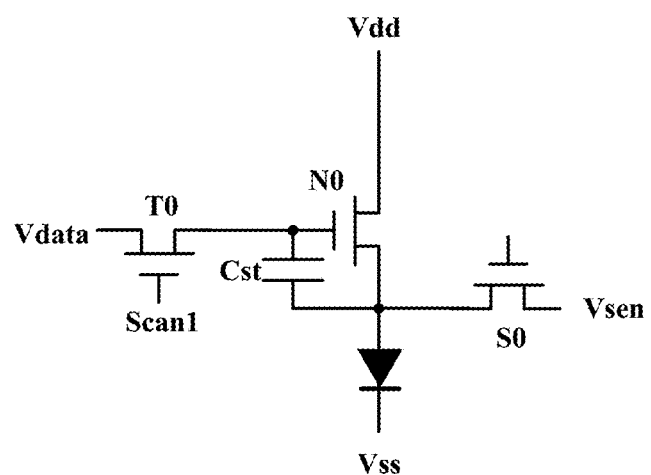
FIG. 2D is a schematic diagram of further another pixel circuit.
Figure 2E:
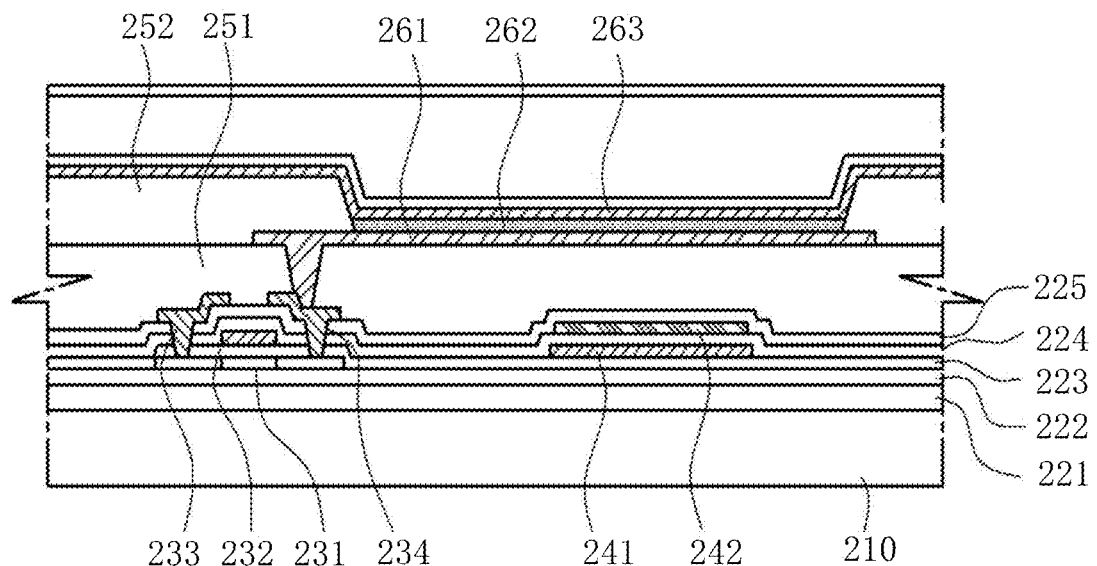
FIG. 2E is a cross-sectional view of a part of a circuit structure according to an embodiment of the present disclosure.

FIG. 2B is a schematic diagram of a pixel circuit, FIG. 2C is a schematic diagram of another pixel circuit, FIG. 2D is a schematic diagram of further another pixel circuit, and FIG. 2E is a cross-sectional view of a part of a circuit structure according to an embodiment of the present disclosure.

As shown in FIG. 2B, a 2T1C pixel circuit used in a display device includes a switching transistor T0, a driving transistor N0 and a storage capacitor Cs, which are configured to drive a light-emitting element (e.g., an organic light-emitting diode (OLED) or a quantum dot light-emitting diode) to emit light. For example, the gate electrode of the switching transistor T0 is connected with a gate line to receive a scan signal Scan1, the source electrode of the switching transistor T0 is connected with a data line to receive a data signal Vdata, and the drain electrode of the switching transistor T0 is connected with the gate electrode of the driving transistor N0; the source electrode of the driving transistor N0 is connected with a first voltage terminal through a power line to receive a first voltage Vdd (high voltage), and the drain electrode of the driving transistor N0 is connected with the positive terminal of the OLED; one end of the storage capacitor Cs is connected with the drain electrode of the switching transistor T0 and the gate electrode of the driving transistor N0, and the other end of the storage capacitor Cs is connected with the source electrode of the driving transistor N0 and connected with the first voltage terminal through the power line; the negative terminal of the OLED is connected with a second voltage terminal through a common cathode (and a cathode ring, etc.) to receive a second voltage Vss (low voltage, such as ground voltage).

As shown in FIG. 2C, another 2T1C pixel circuit used in a display device also includes a switching transistor T0, a driving transistor N0 and a storage capacitor Cs, but the connection mode is slightly changed, and the driving transistor N0 is an N-type transistor. The pixel circuit in FIG. 2C differs from the pixel circuit in FIG. 2B in that the positive terminal of the OLED is connected with the first voltage terminal to receive the first voltage Vdd (high voltage) through a power line (or a common anode, etc.), while the negative terminal of the OLED is connected with the drain electrode of the driving transistor N0, and the source electrode of the driving transistor N0 is connected with the second voltage terminal to receive the second voltage Vss (low voltage, such as ground voltage) through a power line. One end of the storage capacitor Cs is connected with the drain electrode of the switching transistor T0 and the gate electrode of the driving transistor N0, and the other end of the storage capacitor Cs is connected with the source electrode of the driving transistor N0 and the second voltage terminal.

FIG. 2D shows a pixel circuit (i.e., 3T1C circuit) that can detect the threshold voltage of the driving transistor N0, and the driving transistor N0 is an N-type transistor. For example, as shown in FIG. 2D, in order to realize the compensation function, a sensing transistor S0 can be introduced based on the 2T1C circuit, that is, the first terminal of the sensing transistor S0 can be connected with the source electrode of the driving transistor N0, the second terminal of the sensing transistor S0 can be connected with a detection circuit (not shown) through a detection line Vsen, and the gate electrode of the sensing transistor S0 can be connected with a gate line same as or different from the gate line with which the gate electrode of the switching transistor T0 is connected.

Based on the pixel circuit of 2T1C structure, a compensation circuit, a light emitting control circuit, a reset circuit, etc. can be added as needed, so as to realize, for example, a 4T2C pixel circuit, a 7T1C pixel circuit, etc., without being limited in the embodiments of the present disclosure.

FIG. 2E is a cross-sectional view of a part of a circuit structure according to an embodiment of the present disclosure. As described above with reference to FIGS. 2B-2D, the circuit structure can include a pixel circuit, and the pixel circuit can include a switching transistor, a driving transistor and a storage capacitor, etc. As shown in FIG. 2E, the circuit structure can include a substrate 210, a blocking layer 221 arranged on the substrate 210, a buffer layer 222 arranged on the blocking layer 221, a semiconductor layer 231 arranged on the buffer layer 222, a gate insulating layer 223 arranged on the semiconductor layer 231, a gate electrode 232 and a first capacitor electrode 241 arranged on the gate insulating layer 223, a first interlayer insulating layer 224 arranged on the gate electrode 232 and the first capacitor electrode 241, a second capacitor electrode 242 arranged on the first interlayer insulating layer 224, a second interlayer insulating layer 225 arrange on the second capacitor electrode 242, a source electrode 233 and a drain electrode 234 arranged on the second interlayer insulating layer 225, and a planarization layer 251 covering the source electrode 233 and the drain electrode 234. The semiconductor layer 231, the gate electrode 232, the source electrode 233 and the drain electrode 234 form a driving transistor (or a light emitting control transistor), and the first capacitor electrode 241 and the second capacitor electrode 242 are opposite to each other, and form a storage capacitor through the first interlayer insulating layer 224. In the example shown in FIG. 2E, the first capacitor electrode 241 and the gate electrode 232 are in the same layer, and for example, they are formed by a same patterning process. The second capacitor electrode 242 is located in another conductive layer between the conductive layer in which the gate electrode 232 is located and the conductive layer in which the source electrode 233 and the drain electrode 234 are located, and this conductive layer in which the second capacitor electrode 242 is located further includes, for example, other signal lines.

In addition, FIG. 2E also shows an OLED light-emitting element driven by the driving transistor and the storage capacitor. The OLED light-emitting element includes a first electrode 261, a second electrode 263, and a light-emitting layer 262 arranged between the first electrode 261 and the second electrode 263. According to the material of the light-emitting layer, the light-emitting layer can emit light of different colors, such as red light, green light or blue light, etc. The circuit structure further includes a pixel defining layer 252 arranged on the planarization layer 251 and at the edge of the first electrode 261. The drain electrode 234 is electrically connected with the first electrode 261 through a via hole formed in the planarization layer 251.

The blocking layer 221 is used to prevent moisture and/or oxygen from penetrating through the substrate 220. The buffer layer 222 is used to provide a planar surface. The semiconductor layer 231 can include poly-silicon or oxide semiconductor. The semiconductor layer 231 includes a channel region which is not doped with impurities, and a source region and a drain region which are located at both sides of the channel region and doped with impurities, and the source region and the drain region are electrically connected with the source electrode 233 and the drain electrode 234, respectively. The materials of the gate electrode 232, the first capacitor electrode 241 and the second capacitor electrode 242 can include one or more selected from the group consisting of Au, Ag, Cu, Ni, Pt, Pd, Al, Mo, etc.

Various trace lines that are used to provide control signals, data signals, power voltages, etc., for the pixel array, such as gate lines, data lines, detection lines, power lines, reset lines, light emitting control lines, etc., can be formed in different layers. For example, the gate lines can be formed in the same layer as the gate electrode of the above thin film transistor (for example, formed by a same patterning process), and the data lines and detection lines can be formed in the same layer as the source electrode and drain electrode of the above thin film transistor (for example, formed by a same patterning process). For example, the power lines can be formed in the same layer as a shielding layer not shown (for example, formed by a same patterning process), and the light shielding layer can be arranged between the thin film transistor and the substrate 210, so as to block the light from the substrate 210 and avoid the adverse effect of the light on the thin film transistor.

Conductive patterns such as gate lines, data lines, etc., as described above, extend between pixel units in the pixel array for wiring. In the second display region 20, these conductive patterns are grouped together so that these conductive patterns are arranged around a blank region with higher light transmittance. If the gaps connected between the second pixel units 21, such as the gaps between conductive patterns, are small, (single slit) diffraction or (double slit) interference may occur when the incident light passes through these gaps, so that it cannot be used for imaging, and diffraction or interference fringes will be generated. Therefore, these diffraction or interference fringes cause degradation in the imaging quality of the camera 2 located under the second display region 20.

At least one embodiment of the present disclosure provides a display panel, which includes a transparent substrate, a pixel array, a circuit structure and a light shielding portion. The pixel array includes a plurality of pixel units which are arranged on the substrate. At least one pixel unit includes at least one light-emitting element. The circuit structure is configured to drive at least one light-emitting element. The circuit structure includes at least two first conductive patterns and at least one second conductive pattern. The orthographic projections of the at least two first conductive patterns on the substrate are separated from each other by a first gap, and the first gap causes at least a part of imaging light to be diffracted when passing through the first gap. The light shielding portion includes a first light shielding portion. The orthographic projection of at least a part of the first gap on the substrate is located within the orthographic projection of the first light shielding portion on the substrate and within the orthographic projection of the second conductive pattern on the substrate. And the at least one second conductive pattern extends in a direction different from a direction in which the at least two first conductive patterns extend, so as to span the at least two first conductive patterns.

Therefore, in the above embodiment, on the one hand, the gap between the at least two first conductive patterns is shielded by the first light shielding portion; and on the other hand, by appropriate arrangement of the first conductive patterns and the second conductive pattern, the gap between the at least two first conductive patterns is also shielded by the second conductive pattern. Therefore, the gap between the first conductive patterns can be more fully shielded to avoid diffraction and interference of imaging light.

Figure 3A:
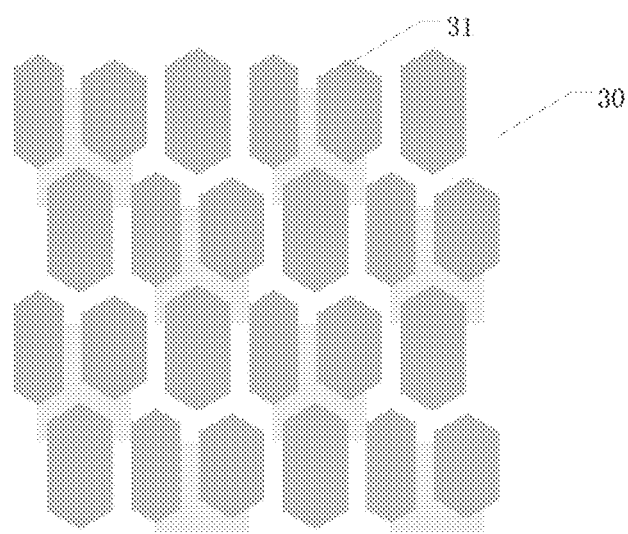
FIG. 3A is a schematic diagram of a first display region of a display panel according to an embodiment of the present disclosure.
Figure 3B:
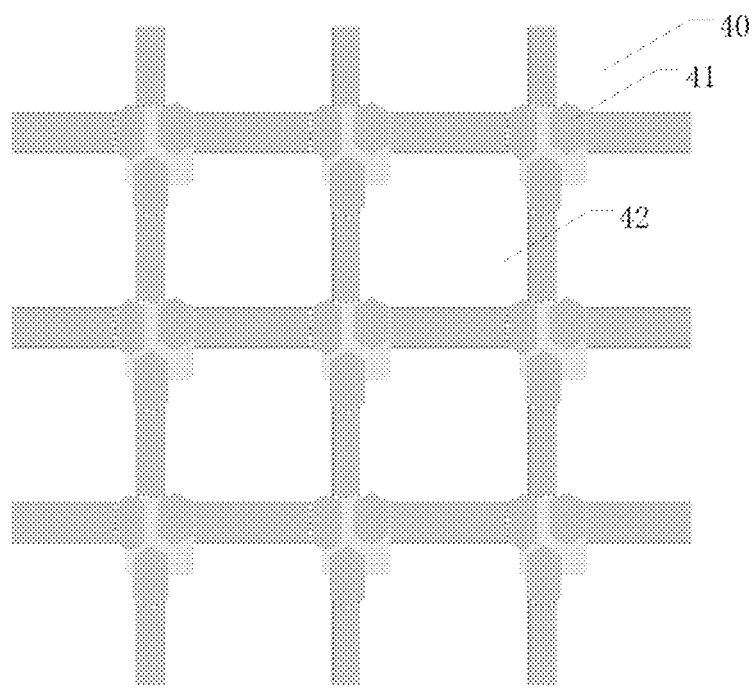
FIG. 3B is a schematic diagram of a second display region of a display panel according to an embodiment of the present disclosure.

FIG. 3A is a schematic diagram of a first display region 30 of a display panel according to an embodiment of the present disclosure, and FIG. 3B is a schematic diagram of a second display region 40 of a display panel according to an embodiment of the present disclosure.

The display panel according to an embodiment of the present disclosure includes a first display region 30 and a second display region 40 at least partially surrounded by the first display region 30, and for example, the exemplary structure shown in FIG. 1A and FIG. 2A can be referred to. Similarly, a camera is provided at the back side (i.e., the non-display side) of the second display region 40 for realizing the design of under-display camera.

As shown in FIGS. 3A and 3B, the first display region 30 includes a plurality of pixel units 31 arranged in an array, and the second display region 40 includes a plurality of pixel units 41 arranged in an array. The first pixel unit 31 can further include a plurality of sub-pixel units, such as a red sub-pixel unit, a green sub-pixel unit, and a blue sub-pixel unit. Similarly, the second pixel unit 41 can further include a plurality of sub-pixel units, such as a red sub-pixel unit, a green sub-pixel unit and a blue sub-pixel unit. The first display region 30 has a first pixel density, and the second display region 40 has a second pixel density which is smaller than the first pixel density. There is a blank region 42 (i.e., a region where there is no component, such as a conductive pattern, blocking the imaging light) between the pixel units 41 in the second display region 40, through which the imaging light is incident into the camera provided in the second display region 40.

Here, the imaging light can include at least one of visible light or infrared light, but the embodiments of the present disclosure are not limited thereto.

Figure 4A:
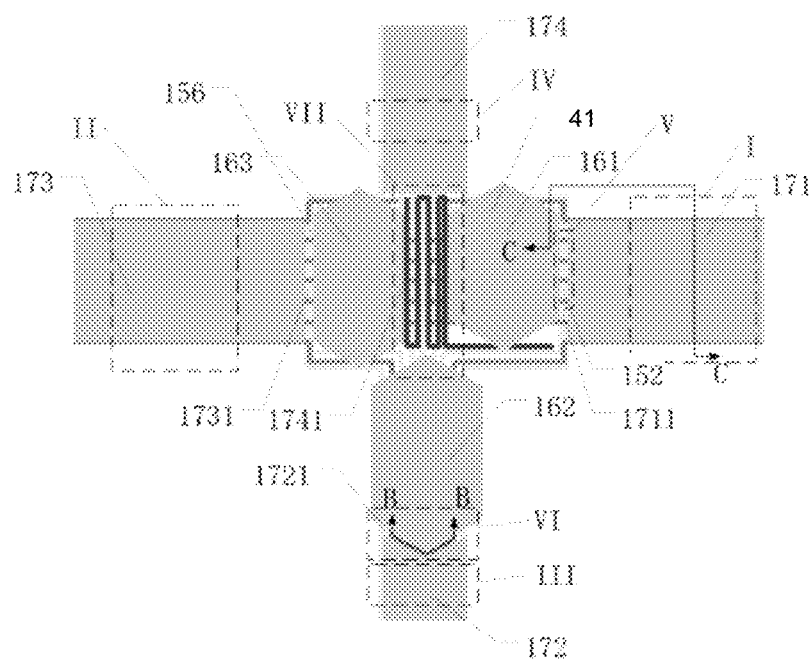
FIG. 4A is a schematic diagram of a pixel unit and a surrounding circuit structure according to an embodiment of the present disclosure.

FIG. 4A illustrates a schematic diagram of a second pixel unit 41 and a surrounding circuit structure according to an embodiment of the present disclosure. For example, the second pixel unit 41 can be one of the pixel units 41 in the second display region 40 shown in FIG. 3B.

Figure 4B:
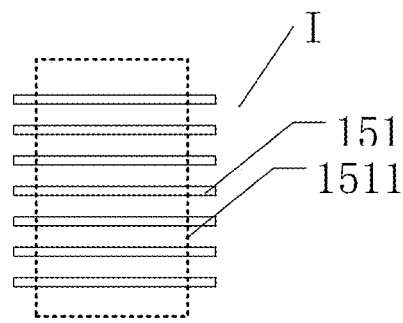
FIG. 4B is a view of part I in FIG. 4A, in which the first light shielding portion is removed.
Figure 4C:
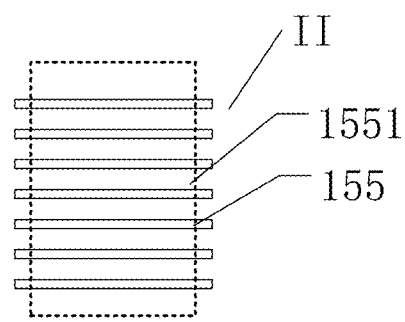
FIG. 4C is a view of part II in FIG. 4A, in which the third light shielding portion is removed.
Figure 4D:
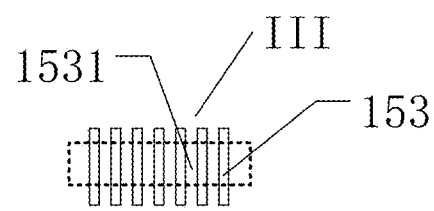
FIG. 4D is a view of part III in FIG. 4A, in which the second light shielding portion is removed.
Figure 4E:
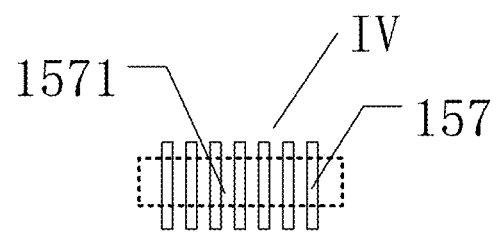
FIG. 4E is a view of part IV in FIG. 4A, in which the fourth light shielding portion is removed.
Figure 4F:
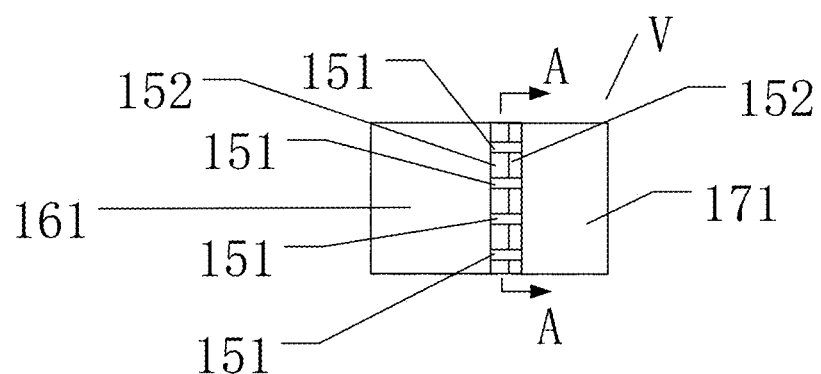
FIG. 4F is an enlarged view of part V in FIG. 4A.
Figure 4G:
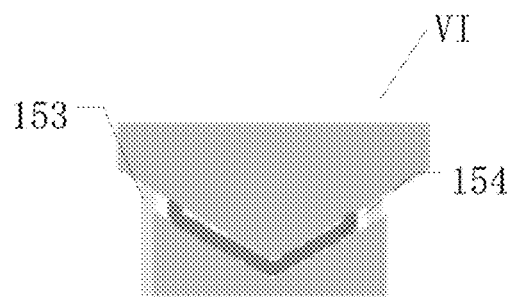
FIG. 4G is an enlarged view of part VI in FIG. 4A.
Figure 4H:
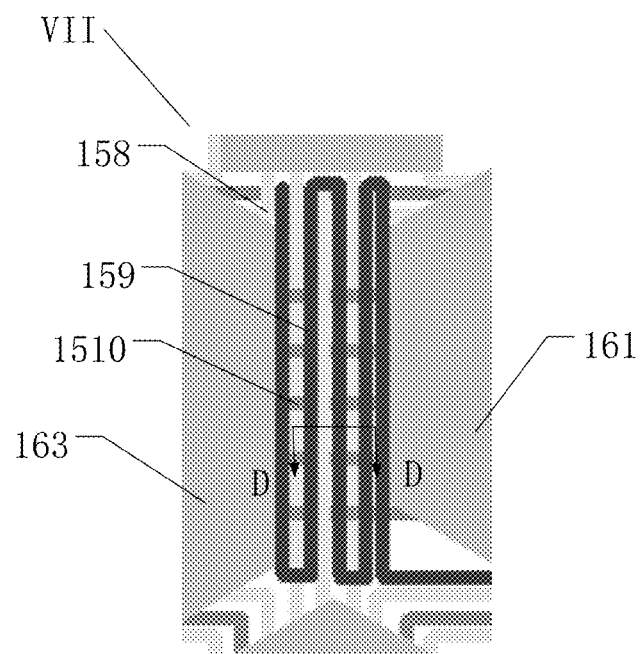
FIG. 4H is an enlarged view of part VII in FIG. 4A.
Figure 5A:
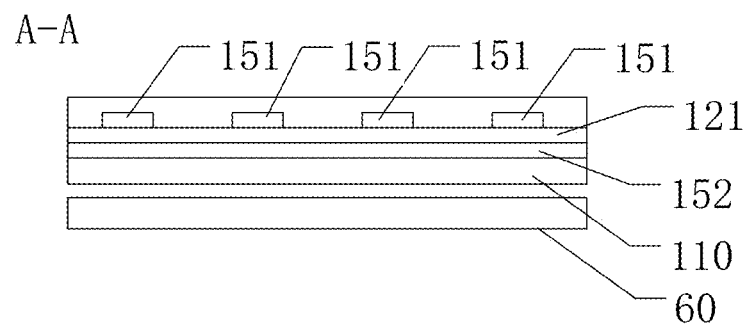
FIG. 5A is a schematic cross-sectional view taken along line A-A in FIG. 4F.
Figure 5B:
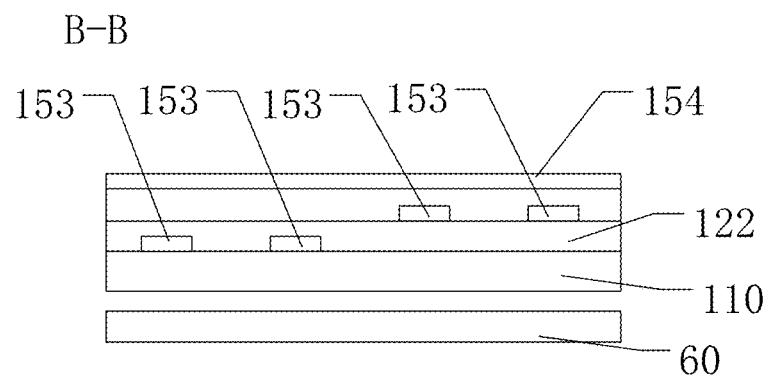
FIG. 5B is a schematic cross-sectional view taken along line B-B in FIG. 4A.
Figure 5C:
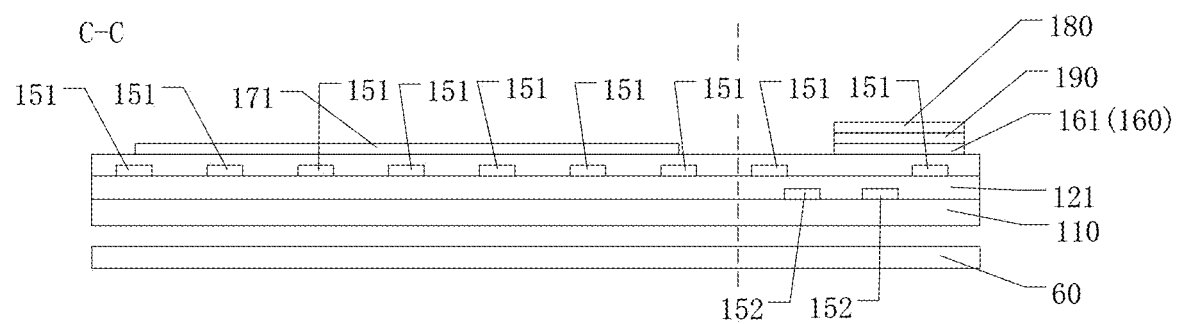
FIG. 5C is a schematic cross-sectional view taken along line C-C in FIG. 4A.
Figure 5D:
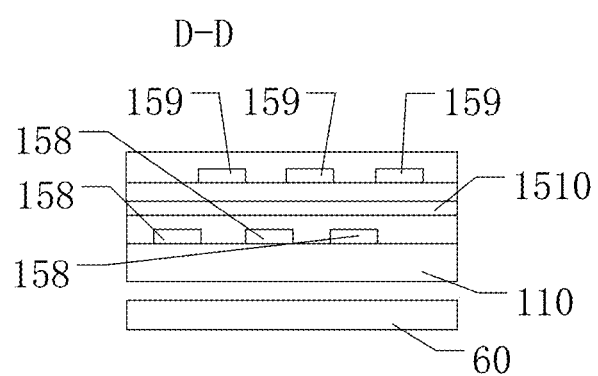
FIG. 5D is a schematic cross-sectional view taken along line D-D in FIG. 4H.

FIG. 4B is a view of part I in FIG. 4A, in which the first light shielding portion is removed. FIG. 4C is a view of part II in FIG. 4A, in which the third light shielding portion is removed. FIG. 4D is a view of part III in FIG. 4A, in which the second light shielding portion is removed. FIG. 4E is a view of part IV in FIG. 4A, in which the fourth light shielding portion is removed. FIG. 4F is an enlarged view of part V in FIG. 4A. FIG. 4G is an enlarged view of part VI in FIG. 4A. FIG. 4H is an enlarged view of part VII in FIG. 4A. FIG. 5A is a schematic cross-sectional view taken along line A-A in FIG. 4F. FIG. 5B is a schematic cross-sectional view taken along line B-B in FIG. 4A. FIG. 5C is a schematic cross-sectional view taken along line C-C in FIG. 4A. FIG. 5D is a schematic cross-sectional view taken along line D-D in FIG. 4H. In order to avoid confusion, some layers are omitted in FIGS. 5A-5D, and only the layers that need to be illustrated are drawn.

As shown in FIGS. 4A-5D, the display panel includes a transparent substrate 110, a pixel array, a circuit structure and a light shielding portion. The pixel array includes a plurality of pixel units, such as first pixel units 50, and the plurality of pixel units are arranged on the substrate 110.

Each pixel unit includes at least one light-emitting element. The circuit structure includes pixel circuits and various trace lines connecting with the pixel circuits. The light-emitting element includes a first electrode 160, a second electrode 180 located at one side of the first electrode 160 away from the substrate 110, and a light-emitting layer 190 arranged between the first electrode 160 and the second electrode 180, as shown in FIG. 5C. For example, the light-emitting element can be an organic light-emitting diode (OLED) element, in which the light-emitting layer 190 is an organic light-emitting layer, the first electrode 160 is an anode and the second electrode 180 is a cathode. In addition, the light-emitting element can also be a light-emitting element of any other type, such as a quantum dot light-emitting diode. The pixel units include, for example, a first pixel unit, a second pixel unit (not shown) on the right side of the first unit, a third pixel unit (not shown) on the lower side of the first unit, a fourth pixel unit (not shown) on the left side of the first unit and a fifth pixel unit (not shown) on the upper side of the first pixel unit.

The circuit structure is configured to drive at least one light-emitting element. The circuit structure includes, for example, one or more selected from the group of gate lines, power lines, data lines, detection lines, etc. As shown in FIG. 4A and FIG. 4F, the circuit structure includes at least two first conductive patterns 151 and at least one second conductive pattern 152. As shown in FIG. 4B, the at least two first conductive patterns 151 include a plurality of (for example, seven in the figure, but the embodiment of the present disclosure is not limited thereto, and for example, two to six and so on are also allowed) strip-shaped trace lines extending in a first direction (the first direction is illustrated as the left-right direction in FIG. 4A) and between the first pixel unit and the second pixel unit. As shown in FIG. 4F, the at least one second conductive pattern 152 extends in a direction different from the direction in which the at least two first conductive patterns 151 extend, so as to span the at least two first conductive patterns 151. For example, the at least one second conductive pattern 152 includes two strip-shaped trace lines extending in a second direction (the second direction is illustrated as the up-down direction in FIG. 4A) perpendicular to the first direction.

For example, the at least two first conductive patterns 151 can include at least one selected from the group consisting of a gate line, a power line, a data line, a detection line, etc., and the at least one second conductive pattern 152 includes at least one selected from the group consisting of a gate line, a power line, a data line, a detection line, etc.

As shown in FIG. 4B, the orthographic projections of the at least two first conductive patterns 151 on the substrate 110 are separated from each other by a first gap 1511, and in order to realize the wiring required by high pixel density, the first gap 1511 is formed to be narrow, so that at least a part of the imaging light is diffracted or interfered when passing through the first gap 1511. Therefore, a light shielding portion is provided to shield the first gap 1511. The width of the first gap 1511 is, for example, less than 10 μm, less than 5 μm or less than 2 μm. According to the wavelength range of the imaging light, the width of the gap to be shielded can be determined by adding a redundancy.

In addition, for the sake of wiring continuity and other reasons, the gap, which does not cause diffraction or interference, between adjacent conductive patterns, can also be at least partially blocked.

As shown in FIG. 4A, the light shielding portion includes a first light shielding portion 171. The first light shielding portion 171 is used to shield most of the first gap 1511. For example, the first light shielding portion 171 is a strip extending in the first direction and between the first pixel unit and the second pixel unit.

The light shielding portion is made of a material capable of blocking imaging light. For example, the transmittance of the material for imaging light is less than 10%, such as less than 5%, or such as less than 1%.

For example, the light shielding portion can be arranged in the same layer as the first electrode 160 and made of the same material as the first electrode 160. Therefore, the first light shielding portion 171 and the first electrode 160 can be formed in the same etching step by using the same mask, and there is no need to manufacture an additional mask or to perform an additional etching step to form the first light shielding portion 171, thus reducing production cost. For example, both the first electrode 160 and the light shielding portion are a single metal layer, such as a metallic silver (Ag) layer, or they can have a laminated structure which includes a first conductive oxide layer, a second conductive oxide layer and a metal layer arranged between the first conductive oxide layer and the second conductive oxide layer. For example, the first conductive oxide layer and the second conductive oxide layer are both indium tin oxide (ITO) layers, and the metal layer is a metallic silver (Ag)

layer. The first conductive oxide layer and the second conductive oxide layer located at both sides of the metal layer can protect the metal layer from oxidation or corrosion, thereby prolonging the service life of the display panel.

As described above, the first light shielding portion 171 of the light shielding portion shields the first gap 1511, so that the imaging light cannot pass through the first gap 1511. The first light shielding portion 171 may not completely shield the first gap 1511. In the present embodiment, the first light shielding portion 171 is arranged in the same layer as the first electrode 160. The first light shielding portion 171 and the first electrode 160 are insulated from each other, so a second gap 1711 is provided between the first light shielding portion 171 and the first electrode 160. That is, a second gap 1711 is arranged between the orthographic projection of the first light shielding portion 171 on the substrate 110 and the orthographic projection of the first electrode 160 (the first sub-electrode 161) on the substrate 110. The orthographic projections of the at least two first conductive patterns 151 on the substrate 110 extend through the orthographic projection of the second gap 1711 on the substrate 110. Therefore, due to the existence of the second gap 1711, a part of the first gap 1511 between the at least two first conductive patterns 151 cannot be completely shielded by the first light shielding portion 171 and the first electrode 160, so that diffraction or interference of light may still occur. In addition, in some examples, in order to realize the wiring required by high pixel density, the second gap 1711 is also formed to be narrow, so that at least a part of the imaging light is diffracted or interfered when passing through the second gap 1711.

In the present embodiment, the orthographic projection of at least a part of the second gap 1711 on the substrate 110 falls within the orthographic projection of the second conductive pattern 152 on the substrate 110. Therefore, the overlapping parts of the first gap 1511 and the second gap 1711 in the direction perpendicular to the substrate 110 is blocked by the second conductive pattern 152. By appropriate arrangement of the first conductive patterns 151 and the second conductive pattern 152 extending across the first conductive patterns 151, the first gap 1511 between the first conductive patterns 151 is fully shielded, and the image quality of the under-display camera is further improved.

As shown in FIG. 4A, the second pixel unit includes a first sub-pixel unit, a second sub-pixel unit and a third sub-pixel unit. Accordingly, the light-emitting element of the second pixel unit includes a first light-emitting element, a second light-emitting element and a third light-emitting element. The first electrode 160 includes a first sub-electrode 161, a second sub-electrode 162 and a third sub-electrode 163. The first sub-pixel unit includes the first light-emitting element, and the first light-emitting element includes the first sub-electrode 161. The second sub-pixel unit includes the second light-emitting element, and the second light-emitting element includes the second sub-electrode 162. The third sub-pixel unit includes the third light-emitting element, and the third light-emitting element includes the third sub-electrode 163. For example, the first sub-pixel unit, the second sub-pixel unit and the third sub-pixel unit can be sub-pixel units used for emitting red light, blue light and green light, respectively.

In addition, as shown in FIGS. 4A-4H, in some examples of the present embodiment, the circuit structure further includes at least two third conductive patterns 153, at least one fourth conductive pattern 154, at least two fifth conductive patterns 155, at least one sixth conductive pattern 156 and at least two seventh conductive patterns 157. Correspondingly, the light shielding portion further includes a second light shielding portion 172, a third light shielding portion 173 and a fourth light shielding portion 174.

Similar to the first conductive patterns 151, for example, the at least two fifth conductive patterns 155 include, for example, seven strip-shaped trace lines extending in the first direction. Similar to the second conductive pattern 152, for example, the at least one sixth conductive pattern 156 includes two strip-shaped trace lines extending in the second direction.

The orthographic projections of the at least two fifth conductive patterns 155 on the substrate 110 are separated from each other by a fifth gap 1551, and the fifth gap 1551 causes at least a part of the imaging light to be diffracted or interfered when passing through the fifth gap 1551. The orthographic projection of at least a part of the fifth gap 1551 on the substrate 110 is located within the orthographic projection of the third light shielding portion 173 on the substrate 110 and within the orthographic projection of the sixth conductive pattern 156 on the substrate 110. That is, the third light shielding portion 173 and the sixth conductive pattern 156 are used to shield the imaging light incident into the fifth gap 1551, so as to to avoid diffraction or interference of the imaging light.

Specifically, a sixth gap 1731 is arranged between the orthographic projection of the third light shielding portion 173 on the substrate 110 and the orthographic projection of the third sub-electrode 163 of the third sub-pixel on the substrate 110. The orthographic projections of the at least two fifth conductive patterns 155 on the substrate 110 extend through the orthographic projection of the sixth gap 1731 on the substrate 110. Therefore, due to the existence of the sixth gap 1731, a part of the fifth gap 1551 cannot be shielded by the third light shielding portion 173 and the third sub-electrode 163. The orthographic projection of at least a part of the sixth gap 1731 on the substrate 110 falls within the orthographic projection of the sixth conductive pattern 156 on the substrate 110. Therefore, the overlapping parts of the fifth gap 1551 and the sixth gap 1731 in the direction perpendicular to the substrate 110 is blocked by the sixth conductive pattern 156. In this way, by appropriate arrangement of the fifth conductive patterns 155 and the sixth conductive pattern 156 extending across the fifth conductive patterns 155, the fifth gap 1551 between the fifth conductive patterns 155 is fully shielded, so as to avoid diffraction or interference of the imaging light.

As shown in FIG. 4A, for example, the at least two third conductive patterns 153 include, for example, seven strip-shaped trace lines extending in the second direction. For example, the at least one fourth conductive pattern 154 includes one strip-shaped trace line extending in a bent manner and across a plurality of third conductive patterns 153.

Similar to the first conductive patterns 151, the orthographic projections of the at least two third conductive patterns 153 on the substrate 110 are separated from each other by a third gap 1531, and the third gap 1531 causes at least a part of the imaging light to be diffracted or interfered when passing through the third gap 1531. The orthographic projection of at least a part of the third gap 1531 on the substrate 110 is located within the orthographic projection of the second light shielding portion 172 on the substrate 110 and within the orthographic projection of the fourth conductive pattern 154 on the substrate 110. That is, the second light shielding portion 172 and the fourth conductive pattern 154 are used to shield the imaging light incident into the third gap 1531, so as to avoid diffraction or interference of the imaging light.

Specifically, a fourth gap 1721 is arranged between the orthographic projection of the second light shielding portion 172 on the substrate 110 and the orthographic projection of the second sub-electrode 162 of the second sub-pixel on the substrate 110. The orthographic projections of the at least two third conductive patterns 153 on the substrate 110 extend through the orthographic projection of the fourth gap 1721 on the substrate 110. The orthographic projection of at least a part of the fourth gap 1721 on the substrate 110 falls within the orthographic projection of the fourth conductive pattern 154 on the substrate 110. In this way, by appropriate arrangement of the third conductive patterns 153 and the fourth conductive pattern 154 extending across the third conductive patterns 153, the third gap 1531 between the third conductive patterns 153 is fully shielded.

As shown in FIG. 4A, for example, the at least two seventh conductive patterns 157 include, for example, seven strip-shaped trace lines extending in the second direction. Similar to the first conductive patterns 151, for example, the orthographic projections of the at least two seventh conductive patterns 157 on the substrate 110 are separated from each other by a seventh gap 1571, and the seventh gap 1571 causes at least a part of the imaging light to be diffracted or interfered when passing through the seventh gap 1571. The orthographic projection of at least a part of the seventh gap 1571 on the substrate 110 is located within the orthographic projection of the fourth light shielding portion 174 on the substrate 110. That is, the seventh light shielding portion is used to shield the imaging light incident into the seventh gap 157, so as to avoid diffraction or interference of the imaging light.

In the present embodiment, for example, the at least one second conductive pattern 152 is respectively integrated with different third conductive patterns 153 among the at least two third conductive patterns 153. The at least one fourth conductive pattern 154 is respectively integrated with different first conductive patterns 151 among the at least two first conductive patterns 151. For example, the at least one sixth conductive pattern 156 is respectively integrated with different third conductive patterns 153 among the at least two third conductive patterns 153.

In addition, as shown in FIG. 4A, an eighth gap 1741 is arranged between the first sub-electrode 161 and the third sub-electrode 163. The orthographic projection of a plurality of conductive patterns on the substrate 110 extends through the orthographic projection of the eighth gap 1741 on the substrate 110. The mutual shielding between the plurality of conductive patterns extending in different directions can be utilized to avoid diffraction or interference of the imaging light. For example, the conductive patterns, of which the orthographic projections on the substrate 110 extend through the orthographic projection of the eighth gap 1741 on the substrate 110, includes an eighth conductive pattern 158 extending in the second direction, a ninth conductive pattern 159 extending in the second direction, and a tenth conductive pattern 1510 extending in the first direction. The orthographic projection of a ninth gap between the eighth conductive patterns 158 on the substrate 110 falls within the orthographic projection of the ninth conductive pattern 159 on the substrate 110 (see FIG. 5D), while the orthographic projection of the tenth conductive pattern 1510 on the substrate 110 spans the orthographic projections of the eighth conductive pattern 158 and the ninth conductive pattern 159 on the substrate 110. The eighth conductive pattern 158 and the ninth conductive pattern 159 are arranged in different layers so as not to be connected with each other.

As shown in FIGS. 4A-4H, the first conductive pattern 151, the second conductive pattern 152, the third conductive pattern 153, the fourth conductive pattern 154, the fifth conductive pattern 155, the sixth conductive pattern 156, the seventh conductive pattern 157, the eighth conductive pattern 158, the ninth conductive pattern 159 and the tenth conductive pattern 1510 described above, can be located in the same layer or in different layers in the display panel. In this regard, for example, the layer structure in FIG. 2E can be referred to. And some of these conductive patterns can be connected with each other to form an integrated conductive pattern.

In an example, the first conductive pattern 151, the fourth conductive pattern 154, the fifth conductive pattern 155, and the ninth conductive pattern 159 can be arranged, for example, in the same layer as the gate electrode 232, the first capacitor electrode 241 or the second capacitor electrode 242 as shown in FIG. 2E. The second conductive pattern 152, the third conductive pattern 153, the sixth conductive pattern 156, the seventh conductive pattern 157 and the eighth conductive pattern 158 can be arranged in the same layer as the source electrode 233 and the drain electrode 234 as shown in FIG. 2E. The tenth conductive pattern 1510 can be arranged in the same layer as the semiconductor layer 231 as shown in FIG. 2E. The tenth conductive pattern 1510 can be doped, and when a voltage is applied thereto, the tenth conductive pattern 1510 is conductive.

As shown in FIG. 5A, the at least two first conductive patterns 151 can be located in the same layer. The at least one second conductive pattern 152 is located at one side of the first conductive pattern 151 close to the substrate 110. The first conductive pattern 151 and the second conductive pattern 152 are separated by the insulating layer 121 therebetween. In some other embodiments, the first conductive patterns 151 can be located in different layers.

As shown in FIG. 5B, the third conductive patterns 153 can be located in different layers. For example, two third conductive patterns 153 are respectively located in the same layer as the first capacitor electrode 241 and in the same layer as the second capacitor electrode 242 as shown in FIG. 2E. The fourth conductive pattern 154 is located at one side of all the third conductive patterns 153 away from the substrate 110. The third conductive patterns 153 located in different layers are separated by the insulating layer 122 therebetween.

As shown in FIG. 5C, the first conductive patterns 151 are located in the same layer, and the first light shielding portion 171 is located at one side of the first conductive pattern 151 away from the substrate 110, so as to shield the imaging light to be incident into the first gap 1511 between the first conductive patterns 151.

As shown in FIG. 5D, the eighth conductive pattern 158 and the ninth conductive pattern 159 are shielded by each other. The eighth conductive pattern 158 shields gaps between the ninth conductive pattern 159, and the ninth conductive pattern 159 shields gaps between eighth conductive pattern 158. The tenth conductive pattern 1510 spans the eighth conductive pattern 158 and the ninth conductive pattern 159 on a layer different from the layers provided with the eighth conductive pattern 158 and the ninth conductive pattern 159.

Referring to FIG. 4A and FIG. 4B, the at least two first conductive patterns 151 extend in parallel to each other in the first direction, and the orthogonal projections of two side edges, opposite to each other in the second direction perpendicular to the first direction, of the first light shielding portion 171 on the substrate 110 are respectively located at the inner side of the orthogonal projections of the outermost two first conductive patterns 151 among the at least two first conductive patterns 151 on the substrate 110. That is, the orthographic projection of the first light shielding portion 171 on the substrate 110 does not exceed the orthographic projection of the outermost two first conductive patterns 151 on the substrate 110 in the second direction, thereby avoiding interference and diffraction of the imaging light and minimizing the shielding to the imaging light.

Figure 6:
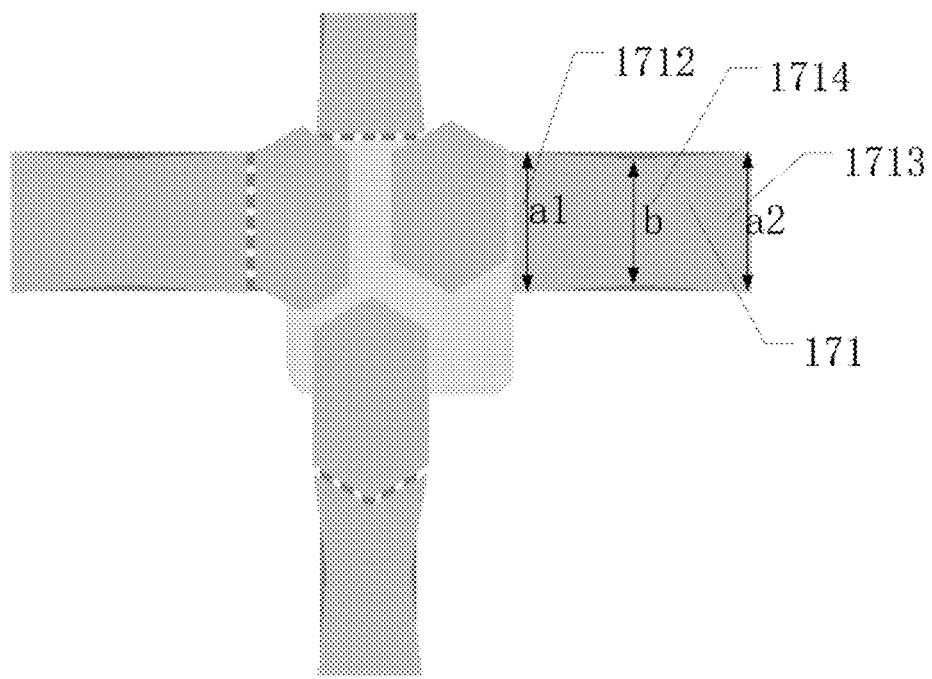
FIG. 6 is a schematic diagram of a pixel unit and a surrounding circuit structure according to another embodiment of the present disclosure.

FIG. 6 is a schematic diagram of a pixel unit and a surrounding circuit structure according to another embodiment of the present disclosure.

Different from the embodiment shown in FIG. 4A, the first light shielding portion 171 includes a first light shielding end portion 1712 close to the first pixel unit, a second light shielding end portion 1713 close to the second pixel unit (not illustrated) located at the right side of the first pixel unit, and an intermediate light shielding portion 1714 between the first light shielding end portion 1712 and the second light shielding end portion 1713. The strip-shaped first light shielding portion 171 has a longitudinal direction (or extending direction); and in the direction perpendicular to the longitudinal direction, the first light shielding end portion 1712 has a first width a1, the second light shielding end portion 1713 has a second width a2, and the intermediate light shielding portion 1714 has a third width b, the third width b is less than the first width a1 and the second width a2, respectively. Therefore, such design can ensure that the first light shielding portion 171 fully shields the gap, which may cause interference and diffraction of the imaging light, between the corresponding conductive patterns at the position close to the pixel unit, and minimizing the shielding to the imaging light at the position away from the pixel unit. In some other examples, the first width a1 may be equal to or unequal to the second width a2.

In addition, at least one embodiment of the present disclosure further provides a display device. The display device can include the display panel as described above and an image sensor 60 (see FIGS. 5A-5D).

As described above, the display panel has a first display region and a second display region, and the pixel density of the first display region is greater than the pixel density of the second display region. The image sensor 60 is located at one side of the substrate 110 away from the pixel array, and the photosensitive surface of the image sensor 60 faces the display panel. The orthographic projection of the image sensor 60 on the substrate 110 is overlapped with the orthographic projection of the second display region on the substrate 110, for example, within the orthographic projection of the second display region on the substrate 110, so that the light passing through the second display region can be used for imaging, thereby realizing the function of the under-display camera.

The image sensor 60 can adopt a common structure in the prior art, such as a complementary metal oxide semiconductor (CMOS) image sensor or a charge coupled device (CCD) image sensor. The image sensor 60 can be electrically connected with an image processor (not shown). In addition to the image sensor 60, in order to achieve a better imaging effect, the display device can further include, for example, a lens assembly, and the lens assembly and the image sensor 60 are sequentially arranged along the optical axis of the lens assembly in the direction perpendicular to the substrate 110.

Figure 7:
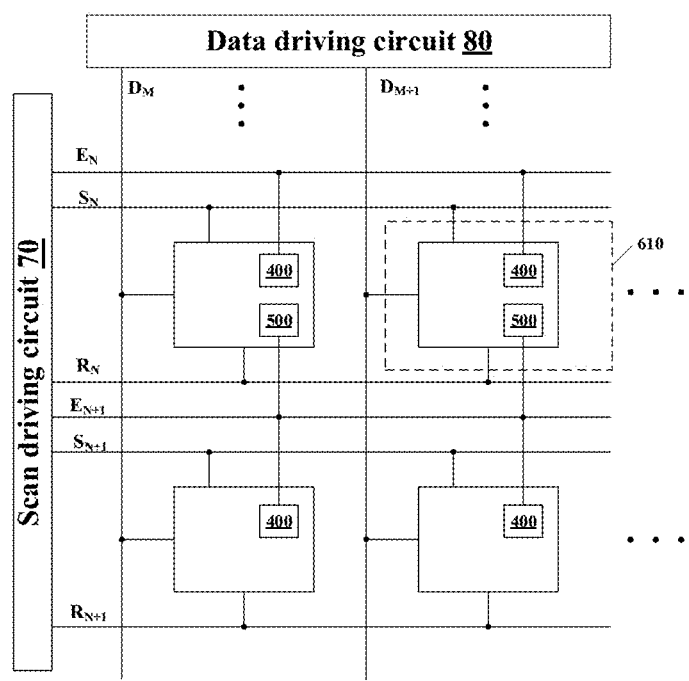
FIG. 7 is a schematic diagram of a circuit structure of a display panel in a display device according to an embodiment of the present disclosure.

FIG. 7 is a schematic diagram of a circuit structure of a display panel in a display device according to an embodiment of the present disclosure. As shown in FIG. 7, the display device includes a plurality of pixel units 610 arranged in an array, a plurality of scan signal lines, a plurality of data signal lines and a plurality of reset control lines. It should be noted that only part of the pixel units 610, the scan signal lines, the data signal lines and the reset control lines are shown in FIG. 7. For example, SN represents the scan signal line of the N-th row, and SN+1 represents the scan signal line of the (N+1)-th row; RN represents the reset control line of the N-th row, and RN+1 represents the reset control line of the (N+1)-th row; DM represents the data signal line of the M-th column, and DM+1 represents the data signal line of the (M+1)-th column. Here, for example, N and M are integers greater than 0. Each pixel unit 610 includes a pixel circuit.

For example, the scan signal line of each row is connected with the switching circuits 200 and the compensation circuits 300 in the pixel circuits of the current row, so as to provide a scan signal Scan; the data signal line of each column is connected with the switching circuits 200 in the pixel circuits of the current column, so as to provide a data signal Vdata; and the reset control line of each row is connected with the reset circuits 600 in the pixel circuits of the current row, so as to provide a reset signal RST (not shown in the figure).

For example, in the case where the pixel circuit in the pixel unit includes a first light emitting control circuit 400 and a second light emitting control circuit 500, the display device can further include a plurality of light emitting control lines. Only the light emitting control line EN of the N-th row and the light emitting control line EN+1 of the (N+1)-th row are shown in FIG. 7.

As shown in FIG. 7, the first light emitting control circuits 400 of the pixel circuits in the pixel units of the N-th row are connected with the light emitting control line EN of the N-th row; the second light emitting control circuits 500 of the pixel circuits in the pixel units of the N-th row are connected with the light emitting control line EN+1 of the (N+1)-th row; the first light emitting control circuits 400 of the pixel circuits in the pixel units of the (N+1)-th row are connected with the light emitting control line EN+1 of the (N+1)-th row; and so on. That is, the second light emitting control circuits 500 in the pixel circuits of the N-th row and the first light emitting control circuits 400 in the pixel circuits of the (N+1)-th row share the light emitting control line EN+1 of the (N+1)-th row.

It should be noted that the display device shown in FIG. 7 can further include a plurality of first voltage lines and a plurality of reset voltage lines which are used to provide a first voltage Vdd and a reset voltage Vinit (not shown in the figure), respectively.

For example, as shown in FIG. 7, the display device can further include a scan driving circuit 70 and a data driving circuit 80.

For example, the data driving circuit 80 can be connected with the plurality of data signal lines (DM, DM+1, etc.), so as to provide the data signal Vdata; and at the same time, the data driving circuit 80 can also be connected with the plurality of first voltage lines (not shown in the figure) and the plurality of reset voltage lines (not shown in the figure), so as to provide the first voltage Vdd and the reset voltage Vinit, respectively.

For example, the scan driving circuit 70 can be connected with the plurality of scan signal lines (SN, SN+1, etc.), so as to provide the scan signal Scan; and at the same time, the scan driving circuit 70 can also be connected with the plurality of light emitting control lines (EN, EN+1, etc.), so as to provide the light emission control signal, and be connected with the plurality of reset control lines (RN, RN+1, etc.), so as to provide the reset signal.

For example, the scan driving circuit 70 and the data driving circuit 80 can be implemented as semiconductor chips. The display device can further include other components, such as a timing controller, a signal decoding circuit, a voltage conversion circuit, etc., and these components can adopt, for example, existing conventional components, which will not be redundantly described here.

The display device provided by the embodiments of the present disclosure can be any product or component having display function, such as a mobile phone, a tablet computer, a television, a display, a notebook computer, a digital photo frame, a navigator, etc.

The scope of the present disclosure is not limited by the embodiments described above, but by the appended claims and their equivalents.

What is claimed is:

1. A display panel, comprising:
a first display region and a second display region, wherein the second display region is at least partially surrounded by the first display region, the second display region comprises a blank region, and the blank region is configured to allow light to pass through;
a substrate;
a pixel array, comprising a plurality of pixel units and arranged on the substrate, wherein at least one pixel unit of the plurality of pixel units comprises at least one light-emitting element, the plurality of pixel units comprise a plurality of first pixel units located in the first display region and a plurality of second pixel units located in the second display region, and the blank region is located between the plurality of second pixel units;
a circuit structure, configured to drive the at least one light-emitting element and comprising a plurality of trace lines that provide signals for a pixel circuit of each of the pixel units in at least one second pixel unit, the plurality of trace lines comprise at least two first conductive patterns and at least one second conductive pattern, and a first gap is located between orthogonal projections of the at least two first conductive patterns on the substrate;
a light shielding portion, comprising:
a first light shielding portion,
wherein an orthographic projection of at least a part of the first gap on the substrate is within an orthographic projection of the first light shielding portion on the substrate, and
the at least one second conductive pattern extends in a direction different from a direction in which the at least two first conductive patterns extend and the at least one second conductive pattern intersects with the at least two first conductive patterns.

2. The display panel according to claim 1, wherein the second pixel unit comprises a first sub-pixel unit, a second sub-pixel unit and a third sub-pixel unit, the first sub-pixel unit comprises a first light-emitting element, the second sub-pixel unit comprises a second light-emitting element, the third sub-pixel unit comprises a third light-emitting element;
a second gap is between the orthographic projection of the first light shielding portion on the substrate and an orthographic projection of a first sub-electrode of the first light-emitting element on the substrate,
the orthographic projections of the at least two first conductive patterns on the substrate extend through an orthographic projection of the second gap on the substrate, and
an orthographic projection of at least a part of the second gap on the substrate falls within the orthographic projection of the at least one second conductive pattern on the substrate.

3. The display panel according to claim 2, wherein the light shielding portion is in a same layer as the first sub-electrode, is made of a same material as the first sub-electrode.

4. The display panel according to claim 3, wherein both the first sub-electrode and the light shielding layer have a laminated structure, and the laminated structure comprises a first conductive oxide layer, a second conductive oxide layer and a metal layer between the first conductive oxide layer and the second conductive oxide layer.

5. The display panel according to claim 4, wherein the first conductive oxide layer, the second conductive oxide layer and the metal layer are respectively a first indium tin oxide layer, a second indium tin oxide layer and a metallic silver layer.

6. The display panel according to claim 2, wherein the at least two first conductive patterns comprise a trace line extending in a first direction between a first sub-pixel unit of one of the second pixel unit in adjacent second pixel units and a third sub-pixel unit of another second pixel unit in the adjacent second pixel units, and the first light shielding portion is a strip extending in the first direction, and the second gap is between the orthographic projection of the first light shielding portion on the substrate and an orthographic projection of a first electrode of the first sub-pixel unit on the substrate.

7. The display panel according to claim 6, wherein the first light shielding portion comprises a first light shielding end portion close to the first sub-pixel unit of the one of the second pixel unit, a second light shielding end portion close to the third sub-pixel unit of the another second pixel unit, and an intermediate light shielding portion between the first light shielding end portion and the second light shielding end portion, and the first light shielding end portion has a first width, the second light shielding end portion has a second width, the intermediate light shielding portion has a third width, and the third width is smaller than the first width and the second width, respectively.

8. The display panel according to claim 6, wherein the light shielding portion further comprises:
a second light shielding portion,
the plurality of trace lines further comprises:
at least two third conductive patterns, wherein a third gap is located between orthographic projections of the at least two third conductive patterns on the substrate; and
at least one fourth conductive pattern,
an orthographic projection of at least a part of the third gap on the substrate is within an orthographic projection of the second light shielding portion on the substrate, and
the at least one fourth conductive pattern extends in a direction different from a direction in which the at least two third conductive patterns extend, and the at least one fourth conductive pattern intersects with the at least two third conductive patterns.

9. The display panel according to claim 8, wherein
the at least two first conductive patterns extend in the first direction, and the at least two third conductive patterns extend in a second direction perpendicular to the first direction,
the second gap is between the orthographic projection of the first light shielding portion on the substrate and an orthographic projection of the first sub-electrode on the substrate,
a fourth gap is between the orthographic projection of the second light shielding portion on the substrate and an orthographic projection of the second sub-electrode on the substrate,
the orthographic projections of the at least two third conductive patterns on the substrate extend through an orthographic projection of the fourth gap on the substrate, and
an orthographic projection of at least a part of the fourth gap on the substrate falls within the orthographic projection of the fourth conductive pattern on the substrate.

10. The display panel according to claim 9, wherein
the at least one fourth conductive pattern is respectively integrated with a corresponding first conductive pattern among the at least two first conductive patterns, and
the at least one second conductive pattern is respectively integrated with a corresponding third conductive pattern among the at least two third conductive patterns.

11. The display panel according to claim 1, wherein
the at least two first conductive patterns extend in parallel to each other in a first direction, and orthogonal projections of two side edges, opposite to each other in a second direction perpendicular to the first direction, of the first light shielding portion on the substrate are respectively located at an outer side of orthogonal projections of outermost two first conductive patterns among the at least two first conductive patterns on the substrate.

12. The display panel according to claim 1, wherein
the at least two first conductive patterns comprise at least one selected from the group consisting of a gate line, a power line, a data line, a detection line, a reset line and a light emitting control line, and the at least one second conductive pattern comprises at least one selected from the group consisting of a gate line, a power line, a data line, a detection line, a reset line and a light emitting control line.

13. The display panel according to claim 1, wherein a width of the first gap is less than 10 μm.

14. The display panel according to claim 1, wherein the light-emitting element is an organic light-emitting diode or a quantum dot light-emitting diode.

15. The display panel according to claim 1, wherein
the first display region has a first pixel density, and the second display region has a second pixel density smaller than the first pixel density.

16. A display device, comprising:
the display panel according to claim 1; and
an image sensor, an orthographic projection of the image sensor on the substrate being overlapped with an orthographic projection of the second display region on the substrate.

\* \* \* \* \*